United States Patent
Pawel et al.

(10) Patent No.: US 7,233,510 B2
(45) Date of Patent: Jun. 19, 2007

(54) CIRCUIT CONFIGURATION WITH ERROR FEEDBACK FOR THE ACTUATION OF POWER SEMICONDUCTOR SWITCHES AND ASSOCIATED METHOD

(75) Inventors: Sacha Pawel, Gotha (DE); Reinhard Herzer, Llmenau (DE); Llja Pawel, Gotha (DE)

(73) Assignee: Semikron Elektronik GmbH & Co. KG, Nuremberg (DE)

( * ) Notice: Subject to any disclaimer, the term of this patent is extended or adjusted under 35 U.S.C. 154(b) by 0 days.

(21) Appl. No.: 11/439,839

(22) Filed: May 23, 2006

(65) Prior Publication Data
US 2006/0268583 A1    Nov. 30, 2006

(30) Foreign Application Priority Data
May 23, 2005  (DE) .................... 10 2005 023 653

(51) Int. Cl.
*H02M 7/5387* (2006.01)
(52) U.S. Cl. .................... 363/132; 363/98; 307/115
(58) Field of Classification Search ............... 363/17, 363/56.02, 98, 132; 307/115, 139, 140; 327/448
See application file for complete search history.

(56) References Cited

U.S. PATENT DOCUMENTS 4,748,532 A * 5/1988 Commander et al. ......... 363/98
5,500,791 A * 3/1996 Kheraluwala et al. ........ 363/17
6,580,625 B2 * 6/2003 Throngnumchai et al. .... 363/97
7,158,389 B2 * 1/2007 Yasumura .................... 363/17

* cited by examiner

*Primary Examiner*—Jessica Han
(74) *Attorney, Agent, or Firm*—Lackenbach Siegel, LLP; Andrew F. Young

(57) ABSTRACT

The invention relates to an integrated circuit configuration proposed for the actuation of power switches disposed in bridge connection and an associated method. The primary side of this circuit configuration is herein connected with the secondary side, which actuates the TOP switch, via a level shifter. The circuit configuration comprises furthermore between the primary side and a secondary side a diode for error status conveyance from the secondary side to the primary side. The anode-side terminal of the diode is connected with the primary side and its cathode-side terminal with the secondary side of the driver circuit. The primary side applies a voltage to this diode. In the presence of error-free operation the secondary side applies level "high" (Vd) to the cathode of the diode and, in the presence of faulty operation, level "low" (Vg). The error status on the secondary side is detected by the primary side thereby that a current flow takes place through the diode, since the secondary side is approximately at ground reference potential via the open BOT switch or via the high-ohmic resistor.

7 Claims, 1 Drawing Sheet

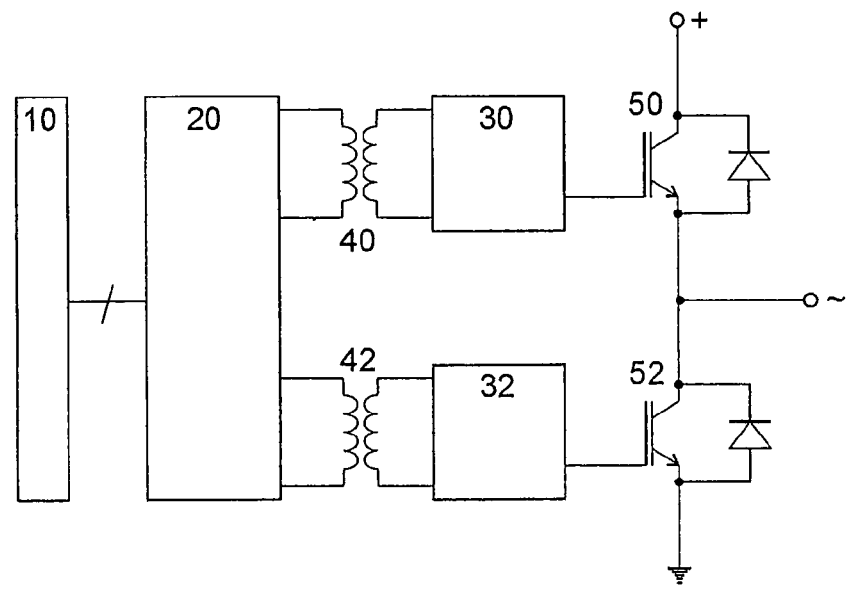
(Prior Art) Fig. 1
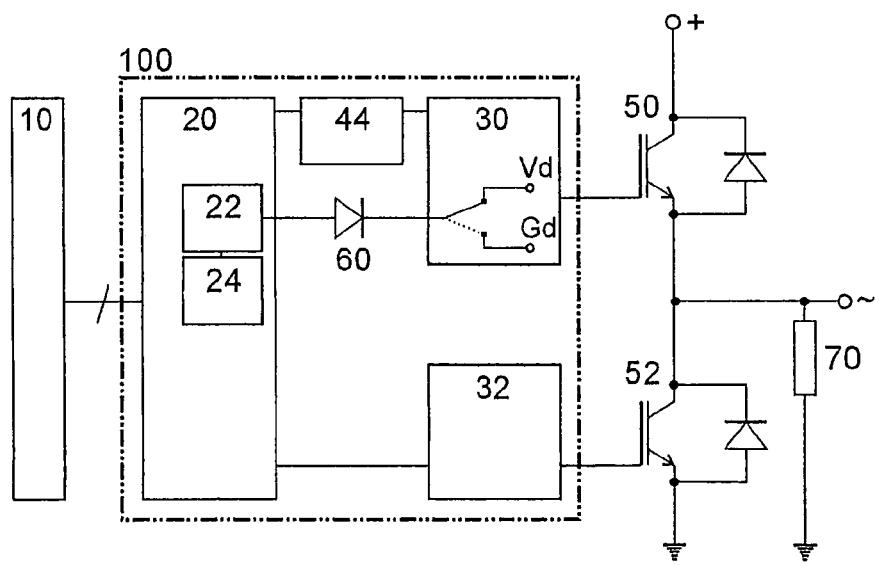
Fig. 2

CIRCUIT CONFIGURATION WITH ERROR FEEDBACK FOR THE ACTUATION OF POWER SEMICONDUCTOR SWITCHES AND ASSOCIATED METHOD

CROSS REFERENCE TO RELATED APPLICATIONS

The present invention claims priority from DE Patent App. No. DE 10 2005 023 653.7 filed May 23, 2005, the entire contents of which are incorporated herein by reference.

FIGURE PREFERRED FOR PUBLICATION

FIG. 2

BACKGROUND OF THE INVENTION

1. Field of the Invention

The present invention relates to a preferably integrated circuit configuration provided for the actuation of power switches disposed in bridge circuit topology as well as an associated method. More specifically, the present invention relates to bridge configurations of power switches known as semi-, H- (two-phase) or as three-phase bridge circuits, the single phase semibridge representing the basic module of such electronic power circuits, wherein in a semibridge circuit, two power switches, a first, so-called TOP switch, and a second, so-called BOT switch, are connected in series. As a rule, such a semibridge is connected to a direct current link and the center tapping is typically connected to a load.

2. Description of the Related Art

To place the present invention in relative context, when the power switches are implemented as a power semiconductor component or as a multiplicity of identical series- or parallel-connected power semiconductor components, an actuation circuit is necessary for the actuation of the power switches. Within the related art such actuation circuits are comprised of several subcircuits or function blocks. The actuation signal from a superordinate control is processed in a first subcircuit of the primary side, and, via further components, supplied to the driver circuits, the secondary sides and lastly to the control input of the particular power switch. In semibridge configurations with higher link voltages, for example greater than 50 V, the primary side, in potential/electrical terms, is isolated from the secondary side for the processing of the control signals, since the power switches, at least the TOP switch of the semibridge, during operation are not at a constant potential and consequently the isolation in terms of voltage is unavoidable. This isolation according to the related art takes place for example by means of isolating transformers, optocouplers, for example optical wave guides. This electrical isolation is at least carried out for the TOP switch, but at higher powers also for the BOT switch due to a possible breaking of the ground reference potential during the switching.

The related art also involves known integrated circuit configurations for power switches of the voltage classes up to 600 V or 1200 V, which forgo the use of external electrical isolation. In these monolithically integrated circuits, according to the related art, so-called level shifters are utilized, at least for the TOP switch. These electronic components and techniques for isolation consequently overcome the potential difference of the primary side with respect to the secondary side.

Referring now to FIG. 1, depicted is a circuit configuration for the actuation of power semiconductor switches in bridge topology according to the related art. For the purpose of simplification only one semibridge is shown. Further bridge topologies are analogous hereto.

In the actuation of power semiconductor components 50, 52, such as for example IGBTs (Insulated Gate Bipolar Transistor) in a circuit configuration in bridge topology, isolation of the potential is necessary due to the voltage difference between the superordinate control 10, for example in the form of a microcontroller 10, and the primary side 20 of the circuit configuration on the one hand, and the secondary side 30, 32 of the circuit configuration and the power semiconductor component 50, 52 on the other hand. According to the related art, various feasibilies for potential isolation are known, for example transformers, optocouplers, optical wave guides or electronic components with appropriate electrical strength.

In the monolithic integration of primary side and secondary side, level shifters are frequently utilized for the transmission of control signals from the primary side to the secondary side. With said components for the potential isolation, switch-on and switch-off signals can be transmitted from the primary side (low voltage side) to the secondary side (high voltage side). Essential for the trouble-free operation of an electronic power system is the primary-side information about operating states of the secondary side, for example information about the concrete switched states of the TOP and of the BOT switch or various error conditions.

Such status polling according to a signal transmission from the secondary to the primary side in the case of hybrid solutions is possible by means of transformers, bi-directional optocouplers or bi-directional optical wave-guides. For monolithically integrated solutions, complementary level shifters, preferably utilizing pMOS high-voltage transistors, are known. Of disadvantage in all of said solutions is that an additional signal path with additional costs and/or additional technology expenditures has to be realized.

In view of the above, those of skill in the art will recognize that what is not appreciated by the related art is that in this described form of a monolithically integrated circuit configuration for actuating power switches no possibility exists, at least in the simplest configuration for the secondary side of the TOP switch, for error feedback to the primary side.

Accordingly, there is a need for an improved monolithically integrated circuit configuration for actuating power switches that responds to this detriment.

OBJECTS AND SUMMARY OF THE INVENTION

An object of the present invention is to introduce a preferably monolithically integrated circuit configuration for power semiconductor switches in bridge configuration, as well as an associated method, which permits the error feedback from the secondary side to the primary side by means of a simple and readily integratable circuit construction.

Another object of the present invention is to provide a circuit configuration for actuating power semiconductor switches in bridge topology comprising of a primary-side section (primary side) and one secondary-side section (secondary side) each, wherein the bridge circuit comprises a first switch, the TOP switch, and a second switch, the BOT switch. These are connected according to the related art to a DC link. The center tapping between the TOP and the BOT switch forms the AC output of the bridge circuit. The circuit configuration for the actuation comprises on its primary side at least one signal processing means and at least one level shifter for the potential-free actuation of at least one secondary side. This secondary side, in turn, comprises at least one signal processing means as well as at least one driver stage for the particular switch.

According to another object of the present invention there is introduced a preferably monolithically integrated circuit configuration for actuating power semiconductor switches, wherein for the conveyance of the error status from the secondary side to the primary side a diode is disposed between the primary side and the secondary side. The anode-side terminal of the diode is disposed at the primary side and the cathode-side terminal at the secondary side of the driver circuit. The circuit configuration furthermore comprises on the primary side a filtering means and a current acquisition means for the error status detection as well as on the secondary side a circuit for the error status implementation. These two circuit sections are connected to the diode.

According to another object of the present invention, there is an associated method providing for the error conveyance from the secondary side to the primary side in a circuit configuration of the above described type comprises on the primary side a current acquisition means as well as preferably a voltage regulation, which applies to the diode a defined voltage equal to or lower than the primary-side operating voltage.

In yet another object of the present invention, there is provided in the presence of trouble-free operation the error status implementation of the secondary side assigned to a TOP switch sets level "high" at the cathode of the diode; during faulty operation this error status implementation has the level "low". As long as the secondary side has a high positive offset voltage relative to the primary side (TOP switch open), no current flow can take place (diode blocked). With the TOP switch closed and the BOT switch open, or through a high-ohmic resistor parallel to the BOT switch, the secondary-side circuit for the error status implementation is pulled to ground reference potential. In this case an implemented error status on the secondary side is detected by the primary side thereby that a current flow is possible through the diode, which is now conducting.

Broadly speaking the present invention relates to an integrated circuit configuration proposed for the actuation of power switches disposed in bridge connection and an associated method. The primary side of this circuit configuration is herein connected with the secondary side, which actuates the TOP switch, via a level shifter. The circuit configuration comprises furthermore between the primary side and a secondary side a diode for error status conveyance from the secondary side to the primary side. The anode-side terminal of the diode is connected with the primary side and its cathode-side terminal with the secondary side of the driver circuit. The primary side applies a voltage to this diode. In the presence of error-free operation the secondary side applies level "high" (Vd) to the cathode of the diode and, in the presence of faulty operation, level "low" (Vg). The error status on the secondary side is detected by the primary side thereby that a current flow takes place through the diode, since the secondary side is approximately at ground reference potential via the open BOT switch or via the high-ohmic resistor.

According to an embodiment of the present invention there is provided a circuit configuration for actuating at least a first (TOP) and a second (BOT) respective power semiconductor switches in a bridge circuit, the circuit configuration comprising: a primary-side section and at least one respective secondary side section for respective power semiconductor switches in the bridge topology, the primary-side section circuitry further comprising: at least a first means for signal processing and at least one level shifter means for potential-free activation of the at least one secondary side section, the at least one secondary side further comprising: at least a second means for signal processing, at least one driver stage means for the respective power semiconductor switch, error acquisition means for conveying and determining an error status from the at least one secondary side section to the primary-side section, the means for conveying and determining an error status further comprising: at least one diode disposed between the primary side section and the at least one secondary side section, the diode having a cathode-side terminal joining the secondary-side section and connected to a secondary-side circuit means for implementing an error status, and the diode having an anode-side terminal joining at least one of a means for filtering and a means for current acquisition on the primary side section.

According to another embodiment of the present invention there is provided a circuit configuration, wherein: a center tapping of the bridge circuit and the secondary-side circuit means for being operably connected to a ground reference potential of the circuit by at least one high-ohmic resistor.

According to another embodiment of the present invention there is provided a circuit configuration, wherein: the diode has an operable electric strength corresponding to a maximum potential difference between the primary-side section and the at least one secondary-side section.

According to another embodiment of the present invention there is provided a method for error conveyance from at least a first secondary side to a primary side in a circuit configuration for actuating at least a first (TOP) and a second (BOT) power semiconductor switch in a bridge circuit, comprising the steps of: providing a circuit configuration comprising: the primary-side section circuitry containing at least a first means for signal processing and at least one level shifter means for potential-free activation of the at least one secondary side section, the at least first secondary side containing at least a second means for signal processing, at least one driver stage means for the respective power semiconductor switch, error acquisition means for conveying and determining an error status from the at least first secondary side section to the primary-side section, the means for conveying and determining an error status further comprising: at least one diode disposed between the primary side section and the at least one secondary side section, the diode having a cathode-side terminal joining the secondary-side section and connected to a secondary-side circuit means for implementing an error status, and the diode having an anode-side terminal joining at least one of a means for filtering and a means for current acquisition on the primary side section, applying a defined voltage to the primary-side section anode of the diode that is equal to or less than an operating voltage, determining during an error-free operation of the at least first secondary side assigned to the TOP switch by the means for conveying and determining an error status that the cathode of the diode is at a high level (Vd), determining during a faulty operation of the at least at least first secondary side assigned to the TOP switch by the means for conveying and determining an error status that the cathode of the diode is at a low level (Vg), and detecting an error status at on the primary side by a current flow occurrence through the diode, whereby the secondary side low level (Vg) is substantially at a ground reference potential via an open the BOT switch.

According to another embodiment of the present invention there is provided a method for error conveyance, further comprising the steps of: conducting a filtering and a time-phase control of a the current flow across the diode, and interpreting the current flow by means of one of an acquisition of a resistor voltage drop due to the current flow and a means for coupling-out of current components in the circuit.

According to another embodiment of the present invention there is provided an alternative method of error conveyance from at least a first secondary side to a primary side in a circuit configuration for actuating at least a first (TOP) and a second (BOT) power semiconductor switch in a bridge circuit, comprising the steps of: providing a circuit configuration comprising: the primary-side section circuitry containing at least a first means for signal processing and at least one level shifter means for potential-free activation of the at least one secondary side section, the at least first secondary side containing at least at least a second means for signal processing, at least one driver stage means for the respective power semiconductor switch, error acquisition means for conveying and determining an error status from the at least first secondary side section to the primary-side section, the means for conveying and determining an error status further comprising: at least one diode disposed between the primary side section and the at least one secondary side section, the diode having a cathode-side terminal joining the secondary-side section and connected to a secondary-side circuit means for implementing an error status, and the diode having an anode-side terminal joining at least one of a means for filtering and a means for current acquisition on the primary side section, applying a defined voltage to the primary-side section anode of the diode that is equal to or less than an operating voltage, determining during an error-free operation of the at least first secondary side assigned to the TOP switch by the means for conveying and determining an error status that the cathode of the diode is at a high level (Vd), determining during a faulty operation of the at least at least first secondary side assigned to the TOP switch by the means for conveying and determining an error status that the cathode of the diode is at a low level (Vg), and detecting an error status at on the primary side by a current flow occurrence through the diode, whereby the secondary side low level (Vg) is substantially at a ground reference potential via a high-ohmic resistor.

According to another embodiment of the present invention there is provided a method for error conveyance, further comprising the steps of: conducting a filtering and a time-phase control of a the current flow across the diode, and interpreting the current flow by means of one of an acquisition of a resistor voltage drop due to the current flow and a means for coupling-out of current components in the circuit.

The above, and other objects, features and advantages of the present invention will become apparent from the following description read in conduction with the accompanying drawings, in which like reference numerals designate the same elements.

BRIEF DESCRIPTION OF THE DRAWINGS

FIG. 1 provides a known circuit configuration.
FIG. 2 provides a circuit configuration further developed according to at least one aspect of the present invention.

DETAILED DESCRIPTION OF THE PREFERRED EMBODIMENTS

Reference will now be made in detail to several embodiments of the invention that are illustrated in the accompanying drawings. Wherever possible, same or similar reference numerals are used in the drawings and the description to refer to the same or like parts or steps. The drawings are in simplified form and are not to precise scale. For purposes of convenience and clarity only, directional terms, such as top, bottom, up, down, over, above, and below may be used with respect to the drawings. These and similar directional terms should not be construed to limit the scope of the invention in any manner. The words "connect," "couple," and similar terms with their inflectional morphemes do not necessarily denote direct and immediate connections, but also include connections through mediate elements or devices.

Referring now to FIG. 2, and in contrast with FIG. 1, a monolithically integrated circuit configuration 100 is developed further according to the invention for the actuation of power semiconductor switches 50, 52 in bridge topology. Herein a diode 60 is disposed between the primary side 20 and the secondary side 30. Diode 60 has an electric strength corresponding to the maximum potential difference between primary side and secondary side. The anode of diode 60 is impressed by the primary side with a voltage equal to or lower than the local operating voltage.

On a secondary side 32 assigned to the BOT switch 52 is connected to the primary side 20 without potential isolation. In the embodiment of the circuit configuration according to the invention and the associated method a circuit section of the primary side 20 monitors whether or not a current flows through the diode 60. As long as the secondary side 30 has a high positive offset voltage relative to the primary side 20, no non-transient current flow through the diode 60 can take place. Consequently, in normal operation during the switched-on phases of TOP switch 50 no status signals can be transmitted from the secondary 20 to the primary side 30. The same applies to error conditions during which secondary side 30 remains at high offset potential. However, if primary 20 and secondary side 30 are at an approximately equal reference potential, as is the case in the actuation mode TOP switch 50 in position "off" and BOT switch 52 in position "on", current can flow through diode 60. In normal operation there is cyclical passage through this state.

In integrated, or also hybrid, systems with their own secondary-side energy supply, for example via bootstrap diodes, this operating state is even compulsory and can therefore be utilized. Here the potential at the cathode-side terminal of the diode 60 is critical. If it is at the operating voltage (Vd) of the secondary side 30, no static current flow occurs at the anode-side terminal due to the dimensioning of the voltage regulation. This state signals the error-free function of the secondary side 30 for example a correctly switched-off TOP switch 50. On the other hand, if the gate driver disposed on the secondary side detects an error during the phase of a switched-on TOP switch 50, this status is locally stored and the secondary-side terminal of the diode 60 is connected to ground reference potential (Gd). In the course of the next succeeding switched-on phase of the BOT switch 52, current flows through diode 60 and signals the detected error status of the secondary side 30 to the error acquisition system or means on the primary side 20. The error acquisition system or means being formed as a current acquisition circuit 22, preferably with a succeeding voltage regulation 24.

The resetting of the secondary-side error store can take place via the next TOP switch-on pulse, since it is only generated when the system ignores the error or interprets it as having been corrected. Voltage regulation on the primary side 20 serves for optimizing the signal-to-noise ratio between transient recharge currents and forward currents of diode 60 due to temporary negative offset voltages with respect to the reliable signal conveyance.

In a simple case, the anode of diode 60 is directly at the potential of the primary-side operating voltage. The acquisition of the current flow can be carried out via resistor voltage drops, coupling-out of current components or other known principles. It is important that a filtering circuit or a filtering means be provided, adapted in analogy to level shifter 44, of the occurring transient recharge currents of diode 60 due to its coupling capacitance between secondary side 30 and primary side 20.

In addition, windowing (time phase control) of the active monitoring phases of the primary-side error acquisition onto those actuation patterns which permit a feasibility of sufficient duration for current interpretation. The structural simplicity of the circuit configuration, as well as forgoing actively switched high-voltage components, allows a robust implementation. In contrast, it has been found to be of disadvantage that the read-out phases are limited in time. Consequently, the method is not completely universal but rather most suitable for the error back transfer during the switched-out phases of the TOP switch 50. On the other hand, a feedback is consequently integratable into the system at a very low expenditure.

The proposed method is generally applicable with the cyclic passing through the switched states of a bridge circuit. In the exemplary application case discussed here, of an operating voltage monitoring of the secondary side 30, it must be ensured by the manner or means of the dimensioning of the capacitive blocking that, after the voltage value falls below the operating voltage threshold, it still retains an adequate value until the next switching phase. Through said circuit configuration and the associated method the error status placed locally into intermediate storage is transmitted from the secondary side to the primary side 20 and a renewed switching-on of TOP switch 50 in the presence of an error is consequently avoided.

Under switching conditions in which both switches are switched off, the reference potential is not defined, but rather floats, such that no reliable conveyance back can take place. To ensure the error transmission in such cases also, by a system, a circuit, or means of a high-ohmic resistor 70, the AC current tapping of the bridge circuit is high-ohmically connected to ground reference potential thereby that the BOT switch 52 is high-ohmically bridged. In the dimensioning of the resistor, the cross current in regular operation must be considered. On the one hand, this current should be minimal, but adequate to discharge the coupling capacitance of the entire bridge output.

In the claims, means- or step-plus-function clauses are intended to cover the structures described or suggested herein as performing the recited function and not only structural equivalents but also equivalent structures. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

The invention claimed is:

1. A circuit configuration for actuating at least a first (TOP) and a second (BOT) respective power semiconductor switches in a bridge circuit, said circuit configuration comprising:
 a primary-side section and at least one respective secondary side section for respective power semiconductor switches in said bridge topology;
 said primary-side section circuitry further comprising:
   at least a first means for signal processing and at least one level shifter means for potential-free activation of said at least one secondary side section;
 said at least one secondary side further comprising:
   at least a second means for signal processing;
   at least one driver stage means for said respective power semiconductor switch;
 error acquisition means for conveying and determining an error status from said at least one secondary side section to said primary-side section;
 said means for conveying and determining an error status further comprising:
   at least one diode disposed between said primary side section and said at least one secondary side section;
   said diode having a cathode-side terminal joining said secondary-side section and connected to a secondary-side circuit means for implementing an error status; and
   said diode having an anode-side terminal joining at least one of a means for filtering and a means for current acquisition on said primary side section.

2. A circuit configuration, according to claim 1, wherein:
 a center tapping of said bridge circuit and said secondary-side circuit means for being operably connected to a ground reference potential of said circuit by at least one high-ohmic resistor.

3. A circuit configuration, according to claim 1, wherein:
 said diode has an operable electric strength corresponding to a maximum potential difference between said primary-side section and said at least one secondary-side section.

4. A method for error conveyance from at least a first secondary side to a primary side in a circuit configuration for actuating at least a first (TOP) and a second (BOT) power semiconductor switch in a bridge circuit, comprising the steps of:
 providing a circuit configuration comprising:
   said primary-side section circuitry containing at least a first means for signal processing and at least one level shifter means for potential-free activation of said at least one secondary side section;
   said at least first secondary side containing at least a second means for signal processing; at least one driver stage means for said respective power semiconductor switch;
   error acquisition means for conveying and determining an error status from said at least first secondary side section to said primary-side section:
     said means for conveying and determining an error status further comprising: at least one diode disposed between said primary side section and said at least one secondary side section; said diode having a cathode-side terminal joining said secondary-side section and connected to a secondary-side circuit means for implementing an error status; and said diode having an anode-side terminal joining at least one of a means for filtering and a means for current acquisition on said primary side section;

applying a defined voltage to said primary-side section anode of said diode that is equal to or less than an operating voltage;

determining during an error-free operation of said at least first secondary side assigned to said TOP switch by said means for conveying and determining an error status that said cathode of said diode is at a high level (Vd);

determining during a faulty operation of said at least first secondary side assigned to said TOP switch by said means for conveying and determining an error status that said cathode of said diode is at a low level (Vg); and detecting an error status at on said primary side by a current flow occurrence through said diode, whereby said secondary side low level (Vg) is substantially at a ground reference potential via an open said BOT switch.

5. A method for error conveyance, according to claim 4, further comprising the steps of:

conducting a filtering and a time-phase control of a said current flow across said diode; and interpreting said current flow by means of one of an acquisition of a resistor voltage drop due to said current flow and a means for coupling-out of current components in said circuit.

6. A method for error conveyance from at least a first secondary side to a primary side in a circuit configuration for actuating at least a first (TOP) and a second (BOT) power semiconductor switch in a bridge circuit, comprising the steps of:

providing a circuit configuration comprising:
said primary-side section circuitry containing at least a first means for signal processing and at least one level shifter means for potential-free activation of said at least one secondary side section;
said at least first secondary side containing at least at least a second means for signal processing; at least one driver stage means for said respective power semiconductor switch;

error acquisition means for conveying and determining an error status from said at least first secondary side section to said primary-side section;
said means for conveying and determining an error status further comprising: at least one diode disposed between said primary side section and said at least one secondary side section; said diode having a cathode-side terminal joining said secondary-side section and connected to a secondary-side circuit means for implementing an error status; and said diode having an anode-side terminal joining at least one of a means for filtering and a means for current acquisition on said primary side section;

applying a defined voltage to said primary-side section anode of said diode that is equal to or less than an operating voltage;

determining during an error-free operation of said at least first secondary side assigned to said TOP switch by said means for conveying and determining an error status that said cathode of said diode is at a high level (Vd);

determining during a faulty operation of said at least first secondary side assigned to said TOP switch by said means for conveying and determining an error status that said cathode of said diode is at a low level (Vg); and detecting an error status at on said primary side by a current flow occurrence through said diode, whereby said secondary side low level (Vg) is substantially at a ground reference potential via a high-ohmic resistor.

7. A method for error conveyance, according to claim 6, further comprising the steps of:

conducting a filtering and a time-phase control of a said current flow across said diode; and interpreting said current flow by means of one of an acquisition of a resistor voltage drop due to said current flow and a means for coupling-out of current components in said circuit.

* * * * *